US009758858B2

(12) United States Patent
Sachs et al.

(10) Patent No.: US 9,758,858 B2
(45) Date of Patent: Sep. 12, 2017

(54) METHODS OF MANUFACTURING A COATED STRUCTURE ON A SUBSTRATE

(71) Applicants: Tyco Electronics Corporation, Berwyn, PA (US); Tyco Electronics AMP GmbH, Bensheim (DE)

(72) Inventors: Soenke Sachs, Frankfurt am Main (DE); Helge Schmidt, Speyer (DE); Michael Leidner, Lambrecht (DE); Eva Henschel, Bensheim (DE); Dominique Freckmann, San Francisco, CA (US); Marjorie Myers, Mount Wolf, PA (US)

(73) Assignees: TYCO ELECTRONICS CORPORATION, Berwyn, PA (US); TE CONNECTIVITY GERMANY GMBH, Bensheim (DE)

( * ) Notice: Subject to any disclaimer, the term of this patent is extended or adjusted under 35 U.S.C. 154(b) by 534 days.

(21) Appl. No.: 13/838,767

(22) Filed: Mar. 15, 2013

(65) Prior Publication Data
US 2014/0099450 A1 Apr. 10, 2014

Related U.S. Application Data

(60) Provisional application No. 61/710,438, filed on Oct. 5, 2012.

(51) Int. Cl.
*C23C 14/30* (2006.01)
*C23C 14/58* (2006.01)
(52) U.S. Cl.
CPC .......... *C23C 14/30* (2013.01); *C23C 14/5873* (2013.01)

(58) Field of Classification Search
CPC ......... C23C 14/08; C23C 14/22; C23C 14/30; C23C 16/487
See application file for complete search history.

(56) References Cited

U.S. PATENT DOCUMENTS 4,827,137 A * 5/1989 Collins ................. B82Y 10/00
250/398
5,012,064 A * 4/1991 Chang .................... C23C 14/30
219/121.15

(Continued)

FOREIGN PATENT DOCUMENTS

WO 99/43025 A1 8/1999
WO 2011/090103 A1 7/2011

OTHER PUBLICATIONS

Wu, D., et al., "Study on the ablation modification effects for EB-PVD ceramic coatings considering the microstructure of the surface". Nuclear Instruments and Methods in Physics Research B, 267 (2009) 3140-3143.*

(Continued)

Primary Examiner — Bret Chen

(57) ABSTRACT

A method of manufacturing a coated structure on a substrate includes positioning a substrate in a vapor deposition chamber having a crucible with source material. The method includes evaporating the source material with electron beams from an irradiation source, the evaporated source material being deposited on the substrate as a coating layer. The method includes ablating the coating layer with the electron beams to selectively remove portions of the coating layer leaving a circuit structure on the substrate. The evaporating and ablating are accomplished in situ within the vapor deposition chamber using the same irradiation source.

9 Claims, 3 Drawing Sheets

(56) References Cited

U.S. PATENT DOCUMENTS

| | | | |
|---|---|---|---|
| 5,599,468 A | 2/1997 | Mako et al. | |
| 5,773,078 A * | 6/1998 | Skelly | C23C 14/083 427/126.2 |
| 5,897,794 A | 4/1999 | Hubbard et al. | |
| 6,153,271 A * | 11/2000 | Mearini | C23C 14/086 427/255.32 |
| 6,312,791 B1 | 11/2001 | Fasano et al. | |
| 6,335,077 B1 | 1/2002 | Tani et al. | |
| 6,863,999 B1 * | 3/2005 | Sudre et al. | 428/704 |
| 7,069,645 B2 | 7/2006 | Ishikawa et al. | |
| 7,321,098 B2 | 1/2008 | Sarma et al. | |
| 7,447,032 B2 | 11/2008 | Ishikawa | |
| 7,833,427 B2 | 11/2010 | Rueger et al. | |
| 2005/0072461 A1 * | 4/2005 | Kuchinski et al. | 136/256 |
| 2006/0278853 A1 | 12/2006 | Yang | |
| 2007/0026160 A1 * | 2/2007 | Strikovski et al. | 427/496 |
| 2007/0128364 A1 * | 6/2007 | Shinozaki | H01L 21/67259 427/294 |
| 2009/0008923 A1 * | 1/2009 | Kaule et al. | 283/67 |
| 2009/0011143 A1 | 1/2009 | Yatsunami et al. | |
| 2009/0139568 A1 * | 6/2009 | Weidman | H01L 31/022425 136/256 |
| 2010/0104766 A1 * | 4/2010 | Neal et al. | 427/530 |
| 2010/0119698 A1 * | 5/2010 | Bihr et al. | 427/8 |
| 2011/0147676 A1 * | 6/2011 | Abe | C04B 35/01 252/512 |
| 2012/0061130 A1 | 3/2012 | Yoshi et al. | |
| 2012/0070685 A1 * | 3/2012 | Kloss | C23C 14/20 428/626 |
| 2012/0269984 A1 | 10/2012 | Koshimizu et al. | |

OTHER PUBLICATIONS

Lin, L., et al., "Ultrasonic characterization of EB-PVD thermal barrier coatings irradiated by HIPIB". Key Engineering Materials, vols. 373-374 (2008) pp. 358-362.*

Yi, Jian, et al., "Electron beam-physical vapor deposition of SiC/SiO2 high emissivity thin film". Applied Surface Science 253 (2007) 4361-4366.*

* cited by examiner

METHODS OF MANUFACTURING A COATED STRUCTURE ON A SUBSTRATE

CROSS REFERENCE TO RELATED APPLICATIONS

This application claims the benefit of U.S. Provisional Application No. 61/710,438 filed Oct. 5, 2012 titled METHODS AND SYSTEMS OF MANUFACTURING ELECTRICAL COMPONENTS, the subject matter of which is herein incorporated by reference in its entirety.

BACKGROUND OF THE INVENTION

The subject matter herein relates generally to methods and systems of manufacturing electrical components.

Electron beam physical vapor deposition (EBPVD) is one type of physical deposition coating methods. With EBPVD, high-quality layers of different materials (e.g. metals, semiconductors, insulators, composite materials) can be deposited on substrates. The EBPVD coating technique is used in many applications, such as in the semiconductor industry, to produce optical coatings, to produce other layers such as capacitive films and food packaging coatings, and the like. The EBPVD process is performed in vacuum where a solid source material is placed in a crucible and heated by an electron beam until it melts and evaporates. The material vapor then condenses on all exposed surfaces and forms a film. Similar to all physical vapor deposition processes, the vapor cannot be spatially controlled. Such techniques are used to apply such coatings to large areas. To produce specified area features on a substrate, known techniques include limit film deposition to selected areas by using masking technology. The smallest feature sizes that can be produced by EBPVD using masking technology is limited by the minimum feature size capability of the masking process used. The functional film material is only deposited within the selected exposed regions defined by the mask. One problem with masking techniques is that most of the material source material of the EBPVD process is wasted because it condenses on the mask and chamber walls. The mask is continuously being replaced, slowing the manufacturing process. Removing and recycling of the condensed source material on the mask is a costly process.

A need remains for methods and systems of manufacturing electrical components having circuit structures in a cost effective manner and without the use of masks.

BRIEF DESCRIPTION OF THE INVENTION

In one embodiment, a method of manufacturing a coated structure on a substrate is provided including positioning a substrate in a vapor deposition chamber having a crucible with source material. The method includes evaporating the source material with electron beams from an irradiation source, the evaporated source material being deposited on the substrate as a coating layer. The method includes ablating the coating layer with the electron beams to selectively remove portions of the coating layer leaving a circuit structure on the substrate. The evaporating and ablating are accomplished in situ within the vapor deposition chamber using the same irradiation source.

Optionally, the method may include passing the electron beams through an electric field. The electric field may be operated to direct the electron beams at the crucible and then at the coating layer. For example, the electric field may be operated in a first operation to direct the electron beams at the crucible and the electric field may be operated in a second operation to direct the electron beams at the coating layer. The method may include directing the electron beams in an emitting direction from the irradiation source through the electric field, operating the electric field to change the direction of the electron beams to direct the electron beams at the crucible in a first direction generally perpendicular to the emitting direction and then operating the electric field to change the direction of the electron beams to direct the electron beams at the coating layer in a second direction generally opposite the first direction.

The method may include controlling at least one of an energy density, an acceleration voltage, a beam direction and a deflection speed of the electron beams. The method may include controlling operation characteristics of the electron beams such that the electron beams directed at the crucible are different than the electron beams directed at the substrate. The method may include irradiating the circuit structure with the electron beams to transform the circuit structure. The method may include irradiating the substrate with the electron beams to transform the substrate.

In a further embodiment, an electrical component forming system is provided that includes a vapor deposition chamber, an irradiation source generating electron beams into the vapor deposition chamber, and a crucible positioned in the vapor deposition chamber holding source material. The source material is irradiated by the electron beams to evaporate the source material. A substrate is positioned in the vapor deposition chamber. The evaporated source material is deposited on the substrate as a coating layer. The coating layer is irradiated by the electron beams to selectively ablate portions of the coating layer to form a circuit structure on the substrate. The circuit structure may be irradiated with the electron beams to transform the circuit structure. The electron beams may be passed through an electric field to control the direction of the electron beams.

DETAILED DESCRIPTION OF THE INVENTION

Embodiments described herein include a method of manufacturing an electrical component that includes using electron beams for electron beam physical vapor deposition of a coating layer on a substrate as well as selective ablation of the coating layer to form a circuit structure on the substrate. Embodiments described herein include a system that uses an electron beam to evaporate source material as a coating layer on a substrate and then uses the electron beam to remove select portions of the coating layer, leaving behind a circuit structure on the substrate. The electron beam may be used to further process the circuit structure, such as to transform the circuit structure or the substrate to enhance one or more properties thereof.

Embodiments described herein may include an electrical component having the form of a circuit board with electrical conductors forming circuits thereon, the electrical conductors being defined by an electron beam. The electrical component may be an antenna.

Embodiments described herein may achieve a high quality circuit structure by using a non-adiabatic electron beam processing technique on the formed circuit structure after portions of the coating layer are ablated and removed from the substrate. For example, heat may be generated inside the circuit structure quickly (e.g. within microseconds), which may transform or modify the material of the circuit structure to enhance properties of the circuit structure. The heat may be used to melt or remelt some or all of the compounds or materials of the circuit structure. In other embodiments, the electrons of the electron beam may react with materials of the circuit structure to transform the circuit structure. Some of the material of the circuit structure may be segregated and/or evaporated by the electron beam during processing to transform the composition of the circuit structure. A hard, highly conductive nano-scale material may be achieved by processing the circuit structure with the electron beam.

Embodiments described herein may provide a circuit structure that is a dense, pore-free metallic coating on the substrate. The circuit structure may have a pure metallic composition. Embodiments described herein produce an electrical conductor that may have properties necessary to provide stable electro-mechanical performance throughout the lifetime of the electrical component. For example, the electrical conductor may have a low and stable electrical contact resistance, a good wear performance, and good resistance to environmental degradation factors such as corrosive gas or high temperature exposures. The electron beam may be precisely controlled allowing for high spatial resolution of the circuit structure. The finish of the circuit structure may be controlled by the electron beam process and the materials of the circuit structure to achieve the desired properties.

Figure 1:
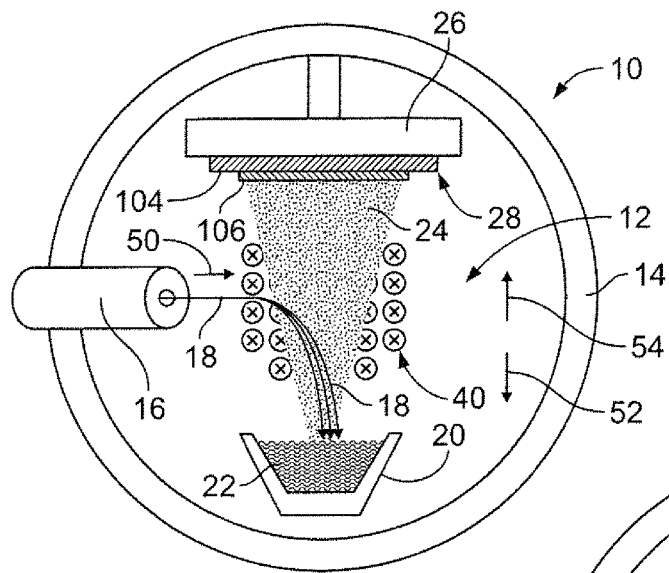
FIG. 1 illustrates an electrical component forming system formed in accordance with an exemplary embodiment.

FIG. 1 illustrates an electrical component forming system 10 formed in accordance with an exemplary embodiment. The system 10 includes a vapor deposition chamber 12 formed by a housing 14. A vacuum may be created in the vapor deposition chamber 12. The system 10 includes an irradiation source 16 generating electron beams 18 and directing the electron beams 18 into the vapor deposition chamber 12.

The system 10 includes a crucible 20 positioned in the vapor deposition chamber 12. The crucible 20 holds source material 22 that is irradiated by the electron beams 18 to evaporate the source material 22 into evaporated source material 24. Optionally, multiple crucibles 20 may be provided in the vapor deposition chamber 12 having different source material 22. The source materials 22 of the different crucibles 20 may be selectively evaporated by the electron beams 18. For example, one source material 22 may be used to form an insulating layer while another source material 22 may be used to form a circuit layer on the insulating layer, such as for manufacturing a metal clad circuit board. Other examples include manufacturing an electrical component having layered electrical conductors, where the different layers provide different characteristics or finishes.

The system 10 includes a sample holder 26 generally opposite the crucible 20. The sample holder 26 holds a sample 28 that is processed to form an electrical component 100 (shown in FIG. 4). The sample 28 includes a substrate 104. The substrate 104 is positioned in the vapor deposition chamber 12. The evaporated source material 24 is deposited on the substrate 104 as a coating layer 106. During forming of the electrical component 100, the coating layer 106 is irradiated (shown in FIG. 2) by the electron beams 18 to selectively ablate portions of the coating layer 106 to form a circuit structure 30 (shown in FIG. 2) on the substrate 104. The coating layer 106 and the circuit structure 30 both define coated structures on the substrate 104. The coating layer 106 is a pre-processed coated structure 106 and the circuit structure 30 is a post-processed coated structure 30 on the substrate 104.

Figure 2:
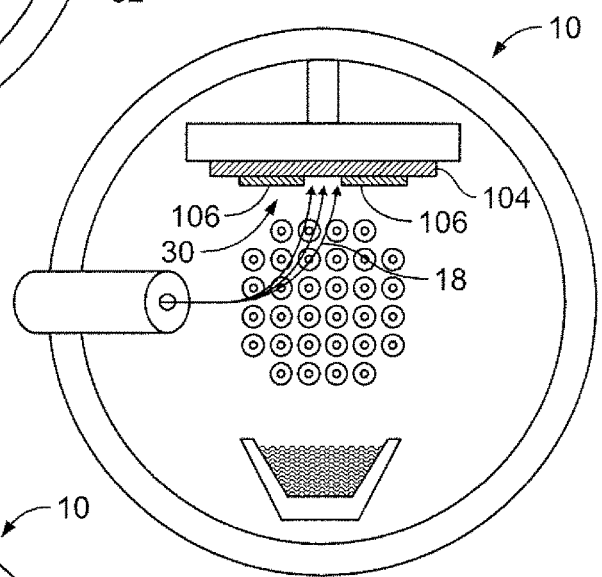
FIG. 2 illustrates the electrical component forming system with electron beams directed toward a coating layer.

The system 10 includes an electric field generator 40 generating an electric field. The electric field may be a magnetic field, an electrostatic field or another type of electric field. In the illustrated embodiment, the electric field generator 40 is a magnetic field generator and may be referred to hereinafter as a magnetic field generator 40, however the subject matter described herein is not limited to magnetic fields. The electron beams 18 pass through the magnetic field. The magnetic field directs the electron beams 18 within the vapor deposition chamber 12. For example, the magnetic field generator 40 controls the magnetic field to initially direct the electron beams 18 toward the crucible 20 and then controls the magnetic field to direct the electron beams 18 toward the substrate 104 (as shown in FIG. 2). The magnetic field may be inverted to change the direction of the electron beams 18.

Fast periodic changes of the magnetic field change the direction of the electron beams 18 from evaporating of the source material 22 to ablation of the coating layer 106 to form the circuit structure 30 on the substrate 104. The same irradiation source 16 is used for both the vapor deposition process and the ablation process. The sample 28 is not moved to a different location for the ablation process by another machine, but rather the vapor deposition and ablation is performed by the electron beams 18 in situ. No need for a mask or changing of a mask that becomes clogged with material is needed, which can reduce the overall processing time of manufacturing electrical components 100.

In an exemplary embodiment, the electron beams 18 are emitted from the irradiation source 16 in an emitting direction 50. Optionally, the emitting direction 50 may be generally horizontal. The magnetic field generator 40 is operated in a first operation to direct the electron beams 18 in a first direction 52 at the crucible 20. The first direction 52 may be generally perpendicular to the emitting direction 50. Optionally, the first direction 52 may be in a generally vertically downward direction. The magnetic field generator 40 is then operated in a second operation to direct the electron beams 18 in a second direction 54 at the coating layer 106. The second direction 54 may be generally opposite to the first direction 52. Optionally, the second direction 54 may be in a generally vertically upward direction. The location at which the electron beams 18 are directed may be precisely controlled by the operation of the magnetic field generator 40. For example, the strength of the magnetic field may be controlled. The location of the magnetic field may be controlled. The polarity of the magnetic field may be controlled.

In operation, the electron beams 18 are deflected by the magnetic field into the crucible 20. The electron beams 18 evaporate the source material 22. The evaporated source material 24 is deposited on the substrate 104 to form the coating layer 106. In an exemplary embodiment, the entire surface of the substrate 104 exposed and facing the crucible 20 is coated with the coating layer 106. The system 10 is capable of achieving a high coating rate, such as several micrometers/minute. The source material 22 may be any type of material depending on the particular application and the desired characteristics of the coating layer 106. For example, the source material 22 may be a metal material and the deposited coating layer 106 is used to form electrical conductors as part of the circuit structure 30. The source material 22 may be used to form insulators on the substrate 104 as part of the circuit structure 30. The system 10 is capable of processing materials having high melting temperatures, such as tungsten, aluminum oxide or other materials, due to the high power density of the electron beams 18.

In operation, after the coating layer 106, or coating layers 106, are deposited on the substrate 104, the electron beams 18 are deflected by the magnetic field toward the substrate 104. The electron beams 18 are selectively directed at the coating layer 106 to selectively remove portions of the coating layer 106 leaving behind portions of the coating layer in a predetermined pattern. The local (x, y) ablation of the coating layer 106 from the substrate 104 can be carried out with a high spatial resolution (e.g. less than 100 micometers) by controlling operation of the magnetic field and operating characteristics or parameter levels of the electron beams 18, such as the energy density, the accelerating voltage, the beam direction, the deflection speed of the electron beam, and the like. The control parameters depend on the pattern of the circuit structure 30, the thickness of the coating layer 106, the composition of the coating layer 106, the material properties of the coating layer 106, such as the density, thermal conductivity, chemical composition and the like. The control parameters are selected to achieve minimal detrimental effect on the surface of the substrate 104. The electron beams 18 are spatially controlled using the magnetic fields to direct the electron beams 18 at the regions to be ablated. Ablation can happen after the coating process and/or periodically during the coating process. The electron beams 18 can be quickly re-directed from the crucible 20 to the coating layer 106 and back by controlling the magnetic fields.

Figure 3:
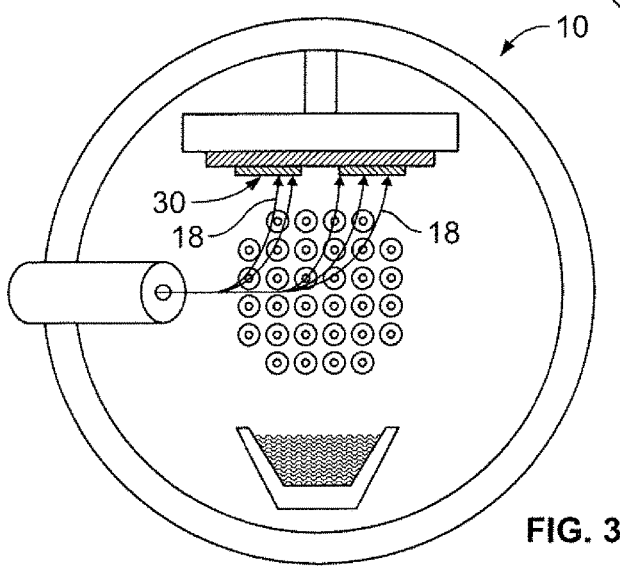
FIG. 3 illustrates the electrical component forming system with the electron beams directed toward a circuit structure.

In an exemplary embodiment, the electron beams 18 may be used for other processing steps of the circuit structure 30 (shown in FIG. 3). For example, the electron beams 18 may transform or modify the circuit structure 30 by irradiating the circuit structure 30. The electron beams 18 may be used to harden the circuit structure 30, to improve the wear resistance of the circuit structure 30, to increase the electrical conductivity of the circuit structure 30, to increase the thermal conductivity of the circuit structure 30, to improve corrosion resistance of the circuit structure 30, and the like.

FIG. 2 illustrates the electrical component forming system 10 with the electron beams 18 directed toward the coating layer 106. The electron beams 18 are directed toward the coating layer 106 by the magnetic fields. The electron beams 18 ablate portions of the coating layer 106 to completely remove the coating layer 106 in predetermined areas, leaving behind the circuit structure 30. The characteristics of the electron beams 18 may be selected to remove the coating layer 106 and may be controlled to minimize damage to the substrate 104. The electron beams may be spatially controlled to achieve a high resolution circuit structure 30.

FIG. 3 illustrates the electrical component forming system 10 with the electron beams 18 directed toward the circuit structure 30. The electron beams 18 are directed toward the circuit structure 30 by the magnetic fields. The electron beams 18 transform the circuit structure 30, such as harden the circuit structure 30, to improve the wear resistance of the circuit structure 30, to increase the electrical conductivity of the circuit structure 30, to increase the thermal conductivity of the circuit structure 30, to improve corrosion resistance of the circuit structure 30, and the like. The characteristics of the electron beams 18 may be selected to achieve the desired modification or transformation of the circuit structure 30. The electron beams may be spatially controlled to achieve a high resolution circuit structure 30.

Figure 4:
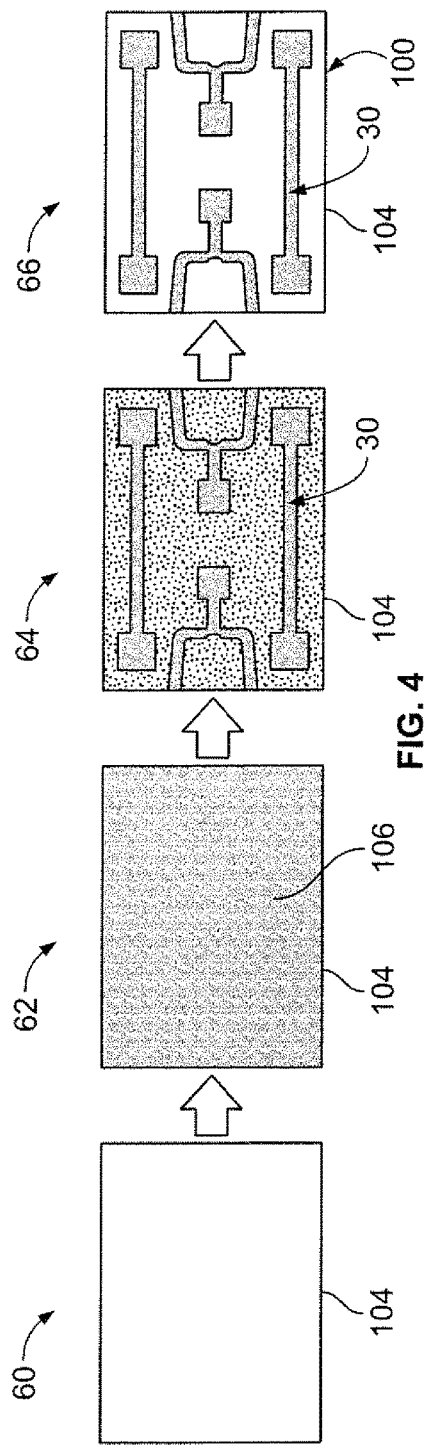
FIG. 4 illustrates various steps of manufacture of an electrical component by the electrical component forming system.

FIG. 4 illustrates various steps of manufacture of the electrical component 100 by the electrical component forming system 10 (shown in FIG. 1). At 60, the bare substrate 104 is shown. The bare substrate 104 may be initially loaded onto the sample holder 26 (shown in FIG. 1) prior to operation of the irradiation source 16. At 62, the substrate 104 is shown with the coating layer 106 completely covering the substrate 104. The coating layer 106 is formed by the evaporated source material being deposited on the substrate 104. At 64, the substrate 104 is shown with portions of the coating layer 106 removed, such as by ablation by the electron beams 18 (shown in FIG. 2). The circuit structure 30 remains deposited on the substrate 104. Any circuit pattern may be defined by the ablation process and controlled by steering or directing the electron beams using the magnetic fields. At 66, the circuit structure 30 is shown after being processed by the electron beams 18 to transform the circuit structure 30. The circuit structure 30 may be densified by processing with the electron beam 18.

Figure 5:
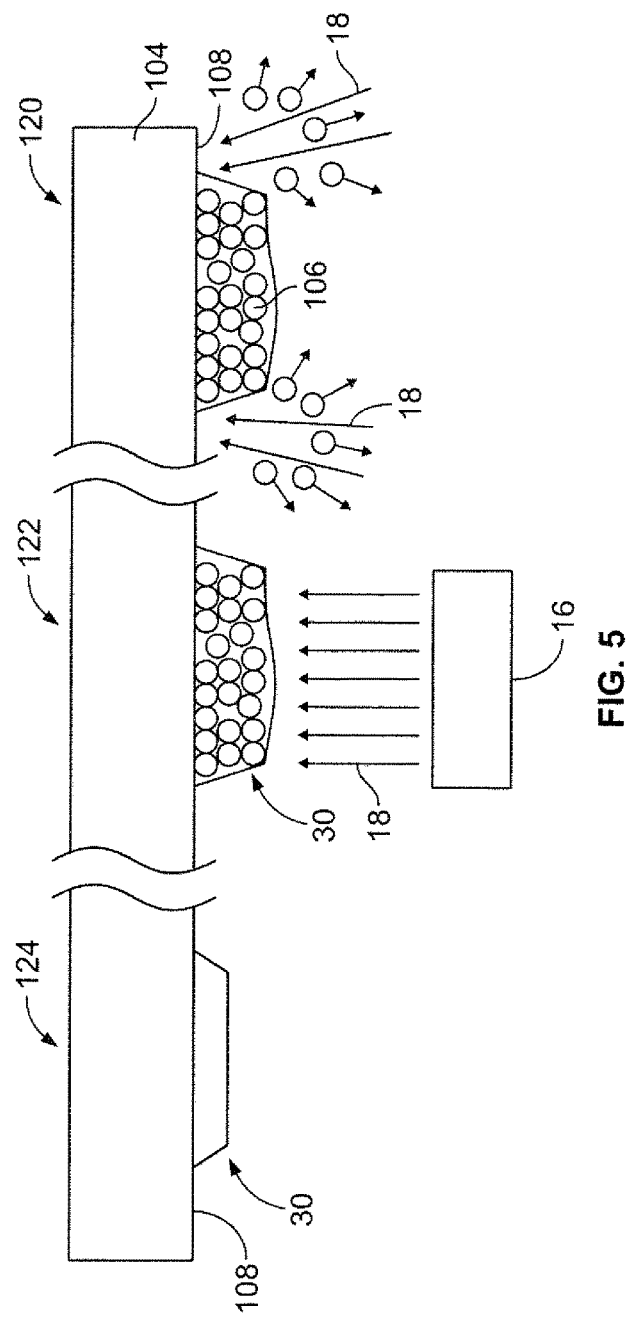
FIG. 5 illustrates the electrical component being processed to form the circuit structure on a substrate.

FIG. 5 illustrates the electrical component 100 being processed to form the circuit structure 30 on the substrate 104. During processing, the coating layer 106 is applied on an outer surface 108 of the substrate 104, such as by the vapor deposition process using the electron beams 18 to evaporate the source material 22 (shown in FIG. 1). Portions of the coating layer 106 are ablated by the electron beam 18 generated from the irradiation source 16.

FIG. 5 illustrates the electrical component 100 at different stages or states of the processing. For example, at 120, the coating layer 106 of the electrical component 100 is shown after ablation, defining the circuit structure 30. Some of the particles of the coating layer 106 are shown being splattered off the substrate 104 by the electron beams 18. At 122, the circuit structure 30 of the electrical component 100 is shown at a processing state, at which the electron beams 18 at least partially penetrate the circuit structure 30. The circuit structure 30 is irradiated to transform or modify one or more properties of the material of the circuit structure 30. At 124, the circuit structure 30 of the electrical component 100 is shown at a post-processing state, after irradiation from the electron beam 18.

In an exemplary embodiment, the substrate 104 may be a non-metallic substrate. For example, the substrate 104 may be a plastic material, an FR-4 material, a ceramic material, a glass epoxy material, a foil, a semi-conductor or another type of dielectric material as the base material. The substrate 104 may be used to form a circuit board or an antenna structure. In an alternative embodiment, the substrate 104 may be a metallic substrate. For example, the substrate 104 may be an aluminum heat sink, such as for use as a substrate of a metal clad circuit board. The substrate 104 may be a copper or copper alloy substrate used to form a contact or terminal.

At or prior to the ablating state 120, the coating layer 106 may be applied by vapor deposition of one or more layers of material on the outer surface 108 of the substrate 104. In an exemplary embodiment, the coating layer 106 includes metal particles of various shapes and sizes. The coating layer 106 may include a binder to promote adhesion and/or a surfactant to prevent metal particle agglomeration (e.g. 1-2 wt %). The coating layer 106 may include a solvent needed for the deposition process(es). Optionally, the coating layer 106 may contain additional flux additives (e.g. commercial brazing flux, borax, and potassium-tetraborate), such as at levels between 1 and 10 wt %. The flux may be added to adjust a wetting behavior of the coating layer 106 during post processing with the electron beam 18. In an exemplary embodiment, the coating layer 106 may have a high metal concentration (e.g. greater than 50 wt %). The metal particles may be silver, gold, copper, nickel, tin, zinc, titanium, palladium, platinum, and the like and/or alloys thereof. The coating layer 106 material may include metal precursors which can be chemically reduced to metals. For example, metal salts, metal oxides, and other metal compounds may be used, such as silver chloride, tin chloride, and silver nitrate. The coating layer 106 may include particles that form conductive insulators when processed.

In an exemplary embodiment, the coating layer 106 and circuit structure 30 may be a microstructure of micro particles and/or nano-particles. During processing with the electron beam 18, such as at 122, the metal particles are melted with the electron beam 18 to generate a solution where the materials are mixed on the atomic scale. Optionally, the circuit structure 30 may be rapidly cooled to quickly solidify the solution to inhibit phase separations and grain growth. Having good mixture of the materials and having quick solidification, leads to a fine material microstructure. Optionally, differently sized and shaped metal particle may be used. Precursors, which are reduced to metallic particles during the irradiation and melting process (e.g. metal salts, metal oxides) may be used.

The processing may be controlled to achieve desired characteristics of the circuit structure 30. The power of the irradiation source 16 may be controlled during processing. The energy density of the electron beam 18 may be controlled during processing. The deflection speed of the electrons may be controlled during processing. The maximum acceleration voltage may be controlled during processing. The maximum electron beam current may be controlled during processing. The beam focus spot size and depth on the target may be controlled during processing. The electron beam 18 may be controlled based on properties of the deposited layer (e.g. layer thickness, layer composition) and the material properties of the circuit structure 30 (e.g. density, thermal conductivity, chemical composition).

The system 10 (shown in FIG. 1) may be equipped with both a backscatter electron and a secondary electron detector which can be used to produce electron beam images of the work piece, similar to a Scanning Electron Microscope (SEM). The images can be viewed live on a screen or saved using a computer. The system 10 may include software to control the functions of the irradiation source 16, such as to program the electron beam 18 to scan defined paths over the sample or to irradiate defined patterns. Optionally, the system 10 may include a heat sink, such as a thick aluminum plate heat sink having a high thermal mass and positioned in good thermal contact with the target.

The electron beam 18 is focused internal of the circuit structure 30. The electron beam 18 at least partially penetrates the circuit structure 30. In an exemplary embodiment, a beam focus spot is in the circuit structure 30 rather than in the substrate 104. Irradiation or heating of the substrate 104 is limited by having the electron beam 18 focused on the circuit structure 30. As the impinging electrons of the electron beam 18 are scattered by the material of the circuit structure 30, kinetic energy of the electrons is converted into heat energy. The scattering probability may be dependent on the energy of the electrons, on the density of the irradiated material of the circuit structure 30, on the beam focus depth, and the like. Optionally, the penetration depth of the electron beam may be between 0.5 µm and 20 µm. In an exemplary embodiment, a characteristic of the energy dependence of the scattering probability is that the maximum of the generated heat density does not lie at the surface of the material but at about ⅓ of the penetration depth. Heat is generated not only at the surface but inside the material of the circuit structure 30. A part of the electrons are reflected or re-emitted from the circuit structure 30. Such electrons can be utilized to generate in-situ SEM pictures during irradiation, such as to control the irradiation process via a feedback control system. The SEM pictures may be used for simultaneous and/or sequential visualization of the circuit structure 30, such as for quality control.

The power of the heat which is generated is dependent on the electron current for a fixed acceleration voltage. The product of the acceleration voltage and the beam current gives the power of the beam. The power can be adjusted by controlling the electron current and/or the acceleration voltage. Another parameter that may be adjusted to control the irradiation process is the duration of irradiation at or near a spot of the circuit structure 30. The position of the electron beam 18 may be controlled by controlling the magnetic fields to direct the electron beam 18 to a desired focus spot. The material of the circuit structure 30 melts if the generated heat exceeds the thermal energy needed to heat the material to its melting point and the latent heat of fusion of the material. Having the heat energy focused in the circuit structure 30, as opposed to the substrate 104, generates heat and melting of the circuit structure 30 very quickly. Optionally, the substrate 104 may act as a heat sink to quickly dissipate heat from the circuit structure 30 after irradiation enabling high cooling rates of the molten film. Quick heating and cooling rates may affect the properties of the electrical conductor formed by the circuit structure 30. For example, the hardness of the circuit structure 30 may be higher with quick heating and cooling as opposed to slow heating and cooling, as is typical of thermal curing in a thermal oven.

During processing, the operation of the electron beam 18 may vary based on the type of material of the circuit structure 30. For example, the operation may be different when using pure metallic material versus using metal precursors. In an exemplary embodiment, in the case of the pure metallic components, the post-processing and irradiation of the coating layer 106 may be controlled by adjusting the energy density and exposure time in such a way that the metal particles sinter or at least one of the metallic components goes into the melt phase and the circuit structure 30 fuses into a homogeneous metallic layer. A two-step process with sintering and subsequent melting is possible in some embodiments. Any non-metallic components (e.g. binder) may be segregated or vaporized leaving the pure metallic layer. In an exemplary embodiment, in the case of the metal precursors, the post-processing and irradiation of the circuit structure 30 is controlled by the energy density and exposure time in such a way that the metal precursors are chemically reduced to metals, either indirectly by the heat input into the circuit structure 30 or directly by interaction of the metal precursors with the electrons of the electron beam 18. The circuit structure 30 may transform into a homogeneous metallic layer when the precursors are chemically altered by the electron beam 18.

The thermal energy generated by the electron beam 18 inside the circuit structure 30 can be controlled by adjusting parameters of the electron beam 18. At low heat energies and long irradiation times, the circuit structure 30 may be only partially melted and may not bond to the substrate 104. At low heat energies and long irradiation times the particles of the circuit structure 30 may be only sintered and not completely melted. In such situations, the circuit structure 30 may not adhere well to the substrate 104 and may be easily displaced mechanically over time. At low heat energies but short irradiation times, portions of the circuit structure 30 may be removed by the electron beam 18, such as by splattering away the material upon irradiation. At higher energies, large dewetted drops and three dimensional islands may remain, which is undesirable. At even higher energies, such as when the energy is too high, the substrate 104 may melt in addition to the circuit structure 30, which provides a poorer electrical interface. The energy level of the electron beam 18 should be controlled to achieve melting of the circuit structure 30 while having good covering of the substrate 104 and without excessive damage to the substrate 104.

During use, particle blowing or spattering may occur, which is desirable during the ablation process, but not during the processing to transform the circuit structure 30. Several physical effects explain the effect of metal particle blowing: a) transfer of momentum, b) electrostatic effects, c) electrodynamic effects, and d) thermodynamic effects. To achieve particle blowing during ablation, the energy level of the electron beam may be higher than during other processing. To reduce particle blowing, the amount of non-metallic components may be reduced or minimized, since the less filler there is between the particles, the higher the number of conductive paths between the particles there are to 'bleed off' excessive charge to ground. To reduce particle blowing, the circuit structure 30 may be preheated such that lower beam power is required before the actual melting. To reduce particle blowing, larger particle sizes of the material of the circuit structure 30 may be used or particles of irregular (non-spherical) shapes may be used to reduce effects of particle blowing, since more mechanical contacts between the particles could increase the forces to move particles relative to each other, as well as possibly creating more conductive paths. To reduce particle blowing, the scanning or irradiation pattern may be selected to heat the material of the circuit structure 30 indirectly via heat conduction, such as through the substrate 104. To reduce particle blowing, the material composition of the circuit structure 30 may have a high metal particle density and/or low porosity to increase the electrical and heat conductivity.

To avoid potential electrical charging of the substrate 104 during irradiation with the electron beam 18, the circuit structure 30 may be grounded. To avoid potential electrical charging of the substrate 104 during irradiation with the electron beam 18, the electron beam 18 may be operated at low accelerating voltages to increase electron emission. To avoid potential electrical charging of the substrate 104 during irradiation with the electron beam 18, a light (e.g. UV or laser) may be used to increase the photoconductivity of the circuit structure 30. To avoid potential electrical charging of the substrate 104 during irradiation with the electron beam 18, the circuit structure 30 may be processed at an increased pressure (e.g. with argon partial pressure).

In an exemplary embodiment, the control of the electron beam 18, such as the amount of thermal energy generated by the electron beam 18, may be varied along the circuit structure 30. For example, by changing operation of the electron beam 18 along one portion of the circuit structure 30 as compared to another portion of the circuit structure 30 the characteristics of the circuit structure 30 may be varied.

For example, resistors may be incorporated into the electrical conductor paths or circuits of the circuit structure 30 by variation of the parameters of the electron beam 18. No assembly or mounting of resistors is then necessary.

Figure 6:
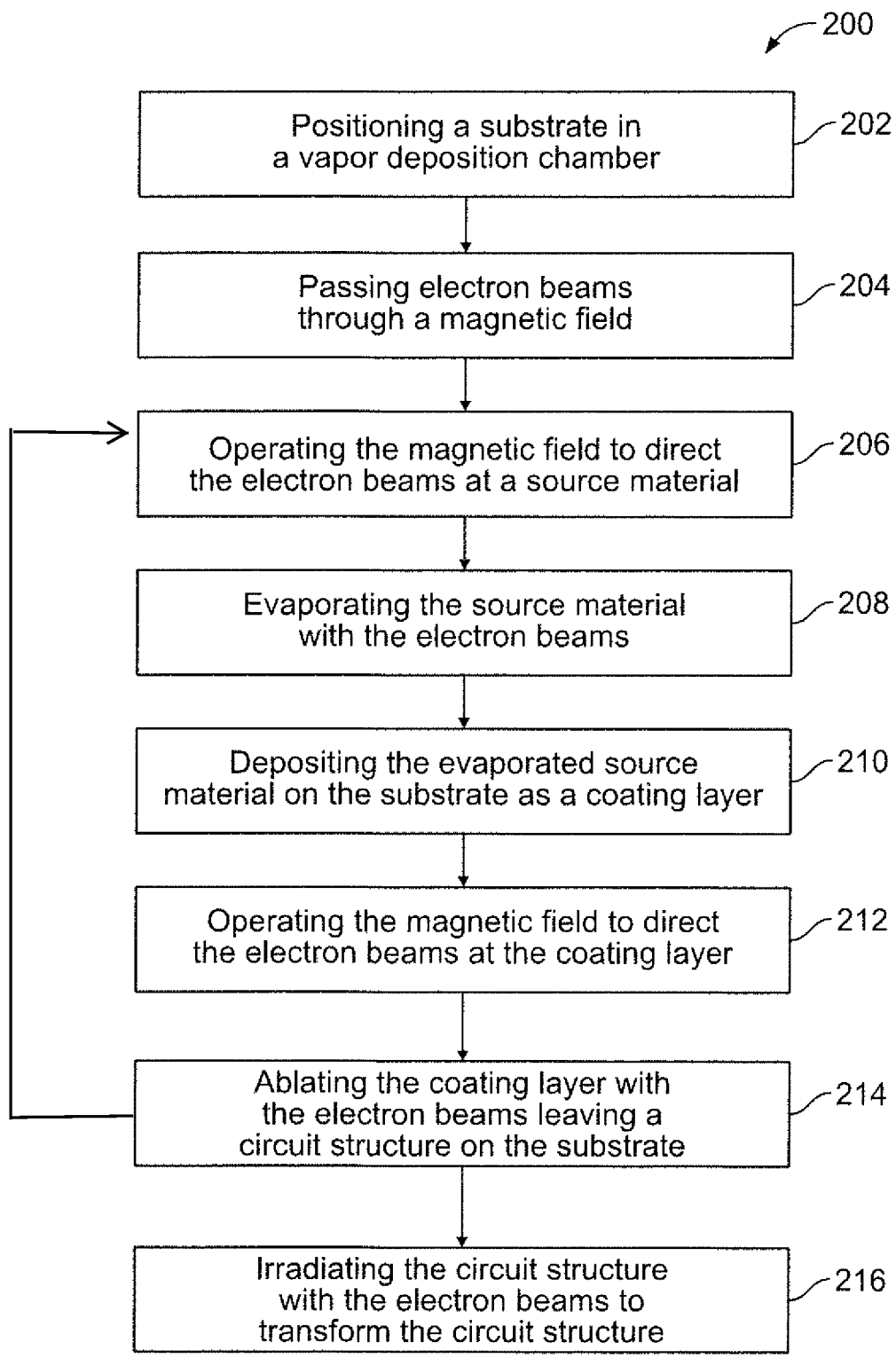
FIG. 6 illustrates a method of manufacturing an electrical component.

FIG. 6 illustrates a method 200 of manufacturing an electrical component, such as a circuit board, an antenna, an insulator network on a metal clad circuit board, a contact, and the like. The method 200 includes providing 202 a substrate in a vapor deposition chamber. The substrate may be a metal substrate, such as for use in forming a metal clad circuit board or a contact. The substrate may include an insulative base, such as plastic, glass, ceramic and the like, such as for use in making a circuit board or semiconductor.

The method 200 includes passing 204 electron beams through a magnetic field. The magnetic field is used to steer or direct the electron beams. At 206, the method includes operating the magnetic field to direct the electron beams at a source material. For example, the source material may be held in a crucible in the vapor deposition chamber. Optionally, multiple crucibles with different source material may be provided in the vapor deposition chamber. The magnetic field may be operated to direct the electron beams into any of the crucibles. At 208, the method 200 includes evaporating the source materials with the electron beams. The operation of the irradiation source emitting the electron beams may be controlled based on the source material, such as to evaporate the source material at a particular rate. At 210, the method includes depositing the evaporated source material on the substrate as a coating layer. The evaporated source material covers the substrate as a coating layer. The process may be controlled to deposit multiple coating layers on the substrate, such as layers of different materials. For example, an insulating coating layer may initially be applied to the substrate and then a conductive circuit layer may be applied to the substrate, such as to form a layered structure useable as a metal clad circuit board.

At 212, the method 200 includes operating the magnetic field to direct the electron beams at the coating layer. The magnetic fields may be inverted to change the direction of the electron beams. The magnetic fields may be quickly changed between directing the electron beams at the crucible and source material and directing the electron beams at the coating layer and substrate. The focus spot of the electron beams may be controlled by controlling operation of the magnetic field and/or the irradiation source. The magnetic field may be operated to direct the electron beams at the crucible and then at the coating layer. For example, the magnetic field may be operated in a first operation to direct the electron beams at the crucible and the magnetic field may be operated in a second operation to direct the electron beams at the coating layer. The method may include directing the electron beams in an emitting direction from the irradiation source through the magnetic field, operating the magnetic field to change the direction of the electron beams to direct the electron beams at the crucible in a first direction generally perpendicular to the emitting direction and then operating the magnetic field to change the direction of the electron beams to direct the electron beams at the coating layer in a second direction generally opposite the first direction.

At 214, the method includes ablating portions of the coating layer with the electron beams leaving a circuit structure on the substrate. Portions of the coating layer are completely removed by the ablation process leaving behind a pattern of the coating layer that defines a circuit structure. Optionally, the method may loop one or more times, such as to step 206 to redirect the electron beams to the source material and deposit additional or another type of source material, on the substrate after portions of the coating layer are ablated. The circuit structure includes conductive traces, pads and the like in a predetermined arrangement depending on the particular application. For example, other components, such as LED modules may be coupled to the corresponding circuits. In other embodiments, the circuit structure may define an antenna or other type of electrical component.

At 216, the method includes irradiating the circuit structure with the electron beams to transform or modify the circuit structure material. The electron beams may be focused on the circuit structure, not to ablate the circuit structure, but to change one or more characteristics of the circuit structure. For example, the material of the circuit structure may be densified by the electron beam processing. The circuit structure may be processed to achieve increased electrical conductivity, increased thermal conductivity, better wear resistance, better corrosion resistance, increased hardness, and the like. Optionally, the substrate may be irradiated with the electron beams to transform the substrate. For example, the substrate may be processed to achieve increased electrical conductivity, increased thermal conductivity, better wear resistance, better corrosion resistance, increased hardness, and the like.

The method may include controlling electron beam characteristics of the electron beam such that the electron beam directed at the crucible uses different parameter levels than the electron beam directed at the substrate. The electron beam may use different parameter levels when ablating the layer(s) as opposed to when irradiating the layer(s). For example, parameter levels of the electron beam, such as the energy density, the accelerating voltage, the beam direction, the deflection speed of the electron beam, and the like, may be varied or controlled. The irradiation source may be used to control the operation characteristics of the electron beam based on use requirements of the electron beam, such as the process being performed, the material being affected the parameter levels, and the like.

The methods and systems described herein of processing a vapor deposited coating layer with an electron beam to selectively ablate portions thereof and/or to process the remaining circuit structure achieve a high quality circuit structure for an electronic component. The process may be performed without wet chemistry and at reduced environmental impact. The metal consumption for manufacturing the electrical component may be reduced as compared to other manufacturing techniques. The process achieves high selectivity and precise placement of the circuit structure. The circuit structure may be processed quickly. The electrical conductors defined by the processed circuit structure provide improved properties compared to standard procedures. For example, the conductors may have higher spatial resolution, increased electrical conductivity, increased thermal conductivity, better wear resistance, better corrosion resistance, increased hardness, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A method of manufacturing a coated structure on a substrate, the method comprising:
   positioning a crucible with source material and a substrate in a vapor deposition chamber;
   controlling an irradiation source to evaporate the source material with an electron beam from the irradiation source by directing the electron beam at the source material, the evaporated source material being deposited on the substrate as a coating layer;
   controlling the irradiation source to change characteristics of the electron beam including directing the electron beam at the coating layer of the substrate to ablate the coating layer with an electron beam from the irradiation source after depositing the source material on the substrate to selectively remove portions of the coating layer leaving a coated structure on the substrate used for forming a circuit structure;
   wherein the evaporating and ablating are accomplished in situ within the vapor deposition chamber using the same irradiation source.

2. The method of claim 1, further comprising passing the electron beam through an electric field, the electric field being used to direct the electron beam at the crucible and then at the coating layer.

3. The method of claim 1, further comprising:
   passing the electron beam through an electric field;
   using the electric field in a first operation to direct the electron beam at the crucible; and
   using the electric field in a second operation to direct the electron beam at the coating layer.

4. The method of claim 1, further comprising:
   passing the electron beam from the irradiation source through an electric field;
   operating the electric field to change the direction of the electron beam towards the crucible, operating the electric field to redirect the electron beam towards the coating layer.

5. The method of claim 1, further comprising controlling at least one of an energy density, an acceleration voltage, a beam direction and a deflection speed of the electron beam.

6. The method of claim 1, further comprising controlling electron beam characteristics such that the electron beam directed at the crucible uses different parameter levels than the electron beam directed at the substrate.

7. The method of claim 1, further comprising irradiating the coated structure with the electron beams to modify the structure material.

8. The method of claim 1, further comprising irradiating the substrate with the electron beam to modify the substrate material.

9. The method of claim 8, further comprising irradiating the substrate with the electron beam to harden the substrate.

* * * * *